United States Patent
Yang et al.

(10) Patent No.: US 10,978,168 B2
(45) Date of Patent: Apr. 13, 2021

(54) SHIFT REGISTER UNIT, METHOD OF DRIVING THE SAME, GATE DRIVING CIRCUIT AND DISPLAY DEVICE

(71) Applicants: HEFEI XINSHENG OPTOELECTRONICS TECHNOLOGY CO., LTD., Anhui (CN); BOE TECHNOLOGY GROUP CO., LTD., Beijing (CN)

(72) Inventors: Tong Yang, Beijing (CN); Yongxian Xie, Beijing (CN)

(73) Assignees: HEFEI XINSHENG OPTOELECTRONICS TECHNOLOGY CO., LTD., Anhui (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/640,201

(22) PCT Filed: Aug. 5, 2019

(86) PCT No.: PCT/CN2019/099196
§ 371 (c)(1),
(2) Date: Feb. 19, 2020

(87) PCT Pub. No.: WO2020/034856
PCT Pub. Date: Feb. 20, 2020

(65) Prior Publication Data
US 2020/0185048 A1    Jun. 11, 2020

(30) Foreign Application Priority Data
Aug. 13, 2018 (CN) .......................... 201810915105.8

(51) Int. Cl.
*G09G 3/22* (2006.01)
*G11C 19/28* (2006.01)

(52) U.S. Cl.
CPC ............... *G11C 19/28* (2013.01); *G09G 3/22* (2013.01); *G09G 2310/0286* (2013.01)

(58) Field of Classification Search
CPC .. G11C 19/28; G09G 3/22; G09G 2310/0286; G09G 2310/0267; G09G 3/20; G09G 3/36
See application file for complete search history.

(56) References Cited

U.S. PATENT DOCUMENTS

2007/0104307 A1   5/2007   Kim et al.
2010/0245337 A1*  9/2010   Hu .......................... G11C 19/28
                                                       345/213
(Continued)

FOREIGN PATENT DOCUMENTS

CN         101847445 A      9/2010
CN         103745700 A      4/2014
(Continued)

OTHER PUBLICATIONS

International Search Report and Written Opinion for Application No. PCT/CN2019/099196, dated Oct. 30, 2019, 11 Pages.

*Primary Examiner* — Carolyn R Edwards
(74) *Attorney, Agent, or Firm* — Brooks Kushman P.C.

(57) ABSTRACT

A shift register unit, a method of driving the same, a gate driving circuit and a display device are provided. The shift register unit includes a pull-up node control circuit, a first pull-down node control circuit, a second pull-down node control circuit, a pull-down node switching control circuit, and a gate driving output circuit. The pull-down node switching control circuit is configured to control the first control voltage signal to be written into the first pull-down node and control the second control voltage signal to be written into the second pull-down node under the control of a frame reset control signal. The gate driving output circuit is configured to control a gate driving signal outputted by a (Continued)

gate driving signal output terminal under the control of the voltage signal of the pull-up node, the voltage signal of the first pull-down node, and the voltage signal of the second pull-down node.

19 Claims, 7 Drawing Sheets

(56) References Cited

U.S. PATENT DOCUMENTS

| | | | |
|---|---|---|---|
| 2015/0187302 A1* | 7/2015 | Dai | G09G 3/006 |
| | | | 345/92 |
| 2015/0255031 A1* | 9/2015 | Cao | G11C 19/28 |
| | | | 345/210 |
| 2017/0270892 A1 | 9/2017 | Wang | |

FOREIGN PATENT DOCUMENTS

| | | | |
|---|---|---|---|
| CN | 105118414 A | 12/2015 | |
| CN | 106205522 A | 12/2016 | |
| CN | 106328084 A | 1/2017 | |
| CN | 107068088 A | 8/2017 | |
| CN | 107978294 A | 5/2018 | |
| KR | 101308440 B1 | 9/2013 | |
| KR | 1020140127378 A | 11/2014 | |

* cited by examiner

SHIFT REGISTER UNIT, METHOD OF DRIVING THE SAME, GATE DRIVING CIRCUIT AND DISPLAY DEVICE

CROSS-REFERENCE TO RELATED APPLICATIONS

This application is the U.S. national phase of PCT Application No. PCT/CN2019/099196 filed on Aug. 5, 2019, which claims priority to Chinese Patent Application No. 201810915105.8 filed on Aug. 13, 2018, which are incorporated herein by reference in their entireties.

TECHNICAL FIELD

The present disclosure relates to the field of display driving technology, in particular to a shift register unit, a method of driving the same, a gate driving circuit and a display device.

BACKGROUND

When a Gate on Array (GOA) circuit including two control voltage terminals is operated, the two control voltage terminals are switched between a high voltage and a low voltage during a blank time period between two frames of display images.

SUMMARY

Some embodiments of the present disclosure provide a shift register unit, a method of driving the same, a gate driving circuit and a display device.

In a first aspect, a shift register unit, includes: a pull-up node control circuit, a first pull-down node control circuit, a second pull-down node control circuit, a pull-down node switching control circuit, and a gate driving output circuit, wherein the pull-up node control circuit is configured to control a potential at a pull-up node; the first pull-down node control circuit is configured to control a potential at a first pull-down node under the control of a voltage signal of the pull-up node and a first control voltage signal; the second pull-down node control circuit is configured to control a potential at a second pull-down node under the control of the voltage signal of the pull-up node and a second control voltage signal; the pull-down node switching control circuit is configured to control the first control voltage signal to be written into the first pull-down node and control the second control voltage signal to be written into the second pull-down node under the control of a frame reset control signal; and the gate driving output circuit is configured to control a gate driving signal outputted by a gate driving signal output terminal under the control of the voltage signal of the pull-up node, the voltage signal of the first pull-down node, and the voltage signal of the second pull-down node.

During implementation, the first pull-down node control circuit is connected to the first pull-down node, the pull-up node, the first voltage terminal, and a first control voltage terminal, the first control voltage terminal is used to input the first control voltage signal; the second pull-down node control circuit is connected to a second pull-down node, the pull-up node, the first voltage terminal, and a second control voltage terminal, the second control voltage terminal is used to input the second control voltage signal; the pull-down node switching control circuit is connected to a frame reset control terminal, the first pull-down node, the second pull-down node, the first control voltage terminal and the second control voltage terminal, and controls the first pull-down node to be connected to the first control voltage terminal to write the first control voltage signal into the first pull-down node, and controls the second pull-down node to be connected to the second control voltage terminal to write the second control voltage signal into the second pull-down node under the control of the frame reset control signal, the frame reset control terminal is used to input the frame reset control signal; and the gate driving output circuit is connected to the pull-up node, the first pull-down node, the second pull-down node, a gate driving signal output terminal, a clock signal terminal, and the first voltage terminal, and configured to control the gate driving signal output terminal to be connected to the clock signal terminal under the control of the voltage signal of the pull-up node, so as to output the clock signal to the gate driving signal output terminal, and control the gate driving signal outputted from the gate driving signal output terminal under the control of the voltage signal of the first pull-down node and the voltage signal of the second pull-down node, the clock signal terminal is used to input the clock signal.

During implementation, the pull-up node control circuit is configured to control the first voltage signal to be written into the pull-up node under the control of a frame reset control signal, control a potential at the pull-up node under the control of an input signal and a reset signal, and control the first voltage signal to be written into the pull-up node under the control of the first pull-down node or the second pull-down node; the pull-up node control circuit is further configured to control the potential at the pull-up node to be a second voltage under the control of the input signal, and control the first voltage signal to be written into the pull-up node under the control of the reset signal.

During implementation, the pull-up node control circuit is connected to the frame reset control terminal, the input terminal, the reset terminal, the first pull-down node, the second pull-down node, the pull-up node and the first voltage terminal; the pull-up node control circuit is configured to control the pull-up node to be connected to the first voltage terminal under the control of a frame reset control signal, so as to control the first voltage signal to be written into the pull-up node PU; control the potential at the pull-up node to a second voltage under the control of an input signal; control the pull-up node to be connected to the first voltage terminal under the control of a reset signal, so as to write the first voltage signal into the pull-up node; and control the first voltage signal to be written into the pull-up node under the control of the first pull-down node or the second pull-down node; the first voltage terminal is used to input the first voltage signal; and the input terminal is used to input the input signal, and the reset terminal is used to input the reset signal.

During implementation, the shift register unit further includes a carry output circuit, wherein the carry output circuit is connected to the pull-up node, the first pull-down node, the second pull-down node, a carry signal output terminal, a clock signal terminal, and a first voltage terminal, and configured to control a clock signal to be outputted to a carry signal output terminal under the control of the voltage signal of the pull-up node; and control the carry signal outputted from the carry signal output terminal under the control of the voltage signal of the first pull-down node and the voltage signal of the second pull-down node.

During implementation, the pull-down node switching control circuit includes: a first switching control transistor, a control electrode thereof connected to the frame reset control terminal, a first electrode thereof connected to the first control voltage terminal, and a second electrode thereof connected to the first pull-down node; and a second switching control transistor, a control electrode thereof connected to the frame reset control terminal, and a first electrode thereof connected to a second control voltage terminal, and a second electrode thereof connected to the second pull-down node.

During implementation, the pull-up node control circuit includes: an input transistor, a control electrode and a first electrode thereof connected to the input terminal, and a second electrode thereof connected to the pull-up node; a reset transistor, a control electrode thereof connected to the reset terminal, a first electrode thereof connected to the pull-up node, and a second electrode thereof connected to the first voltage terminal; a frame reset control transistor, a control electrode thereof connected to the frame reset control terminal, a first electrode thereof connected to the pull-up node, and a second electrode thereof connected to the first voltage terminal; a first pull-up node noise reduction transistor, a control electrode thereof connected to the first pull-down node, a first electrode thereof connected to the pull-up node, and a second electrode thereof connected to the first voltage terminal; and a second pull-up node noise reduction transistor, a control electrode thereof connected to the second pull-down node, a first electrode thereof connected to the pull-up node, and a second electrode thereof connected to the first voltage terminal; the input terminal is used to input the input signal, the reset terminal is used to input the reset signal, the frame reset control terminal is used to input the frame reset control signal, and the first voltage terminal is used to input the first voltage signal.

During implementation, the first pull-down node control circuit may include a first pull-down control node control sub-circuit and a first pull-down node control sub-circuit, the first pull-down control node control sub-circuit is connected to the first control voltage terminal, the first pull-down control node, the pull-up node, and the first voltage terminal, and configured to control the potential at the first pull-down control node under the control of a first control voltage signal and a voltage signal of the pull-up node; the first pull-down node control sub-circuit is connected to the first pull-down control node, the pull-up node, the first pull-down node, a first control voltage terminal, and the first voltage terminal, and is configured to control the potential at the first pull-down node under the control of a voltage signal of the first pull-down control node, a voltage signal of the pull-up node, and the first control voltage signal.

During implementation, the first pull-down control node control sub-circuit includes: a first pull-down control transistor, a control electrode and a first electrode thereof connected to the first control voltage terminal, and a second electrode thereof connected to the first pull-down control node; a second pull-down control transistor, a control electrode thereof connected to the pull-up node, a first electrode thereof connected to the first pull-down control node, and a second electrode thereof connected to the first voltage terminal; the first pull-down node control sub-circuit includes: a third pull-down control transistor, a control electrode thereof connected to the first pull-down control node, a first electrode thereof connected to the first pull-down node, and a second electrode thereof connected to the first control voltage terminal; and a fourth pull-down control transistor, a control electrode thereof connected to the pull-up node, a first electrode thereof connected to the first pull-down node, and a second electrode thereof connected to the first voltage terminal.

During implementation, the second pull-down node control circuit includes a second pull-down control node control sub-circuit and a second pull-down node control sub-circuit, the second pull-down control node control sub-circuit is connected to the second control voltage terminal, a second pull-down control node, the pull-up node and the first voltage terminal, and is configured to control the potential at the second pull-down control node under the control of a second control voltage signal and a voltage signal of the pull-up node; the second pull-down node control sub-circuit is connected to the second pull-down control node, the pull-up node, the second pull-down node, a second control voltage terminal, and the first voltage terminal, and configured to control the potential at the second pull-down node under the control of a voltage signal of the second pull-down control node, a voltage signal of the pull-up node, and the second control voltage signal.

During implementation, the second pull-down control node control sub-circuit includes: a fifth pull-down control transistor, a control electrode and a first electrode thereof connected to the second control voltage terminal, and a second electrode thereof connected to the second pull-down control node; and a sixth pull-down control transistor, a control electrode thereof connected to the pull-up node, a first electrode thereof connected to the second pull-down control node, and a second electrode thereof connected to the first voltage terminal; the second pull-down node control sub-circuit includes: a seventh pull-down control transistor, a control electrode thereof connected to the second pull-down control node, a first electrode thereof connected to the second pull-down node, and a second electrode thereof connected to a second control voltage terminal; and an eighth pull-down control transistor, a control electrode thereof connected to the pull-up node, a first electrode thereof connected to the second pull-down node, and a second electrode thereof connected to the first voltage terminal.

During implementation, the gate driving output circuit includes: a gate driving output transistor, a control electrode thereof connected to the pull-up node, a first electrode thereof connected to a clock signal terminal, and a second electrode thereof connected to a gate driving signal output terminal; a storage capacitor, a first terminal thereof connected to the pull-up node, and a second terminal thereof connected to the gate driving signal output terminal; a first output noise reduction transistor, a control electrode thereof connected to the first pull-down node, a first electrode thereof connected to the gate driving signal output terminal, and a second electrode thereof connected to a first voltage terminal; and a second output noise reduction transistor, a control electrode thereof connected to the second pull-down node, a first electrode thereof connected to the gate driving signal output terminal, and a second electrode thereof connected to the first voltage terminal.

During implementation, the carry output circuit includes: a first carry output transistor, a control electrode thereof connected to the pull-up node, a first electrode thereof connected to a clock signal terminal, and a second electrode thereof connected to the carry signal output terminal; a second carry output transistor, a control electrode thereof connected to the first pull-down node, a first electrode thereof connected to the carry signal output terminal, and a second electrode thereof connected to a first voltage terminal; and a third carry output transistor, a control electrode thereof connected to the second pull-down node, a first electrode thereof connected to the carry signal output terminal, and a second electrode thereof connected to the first voltage terminal.

During implementation, the pull-down node switching control circuit includes: a first switching control transistor, a control electrode thereof connected to the frame reset control terminal, a first electrode thereof connected to the first control voltage terminal, and a second electrode thereof connected to the first pull-down node; and a second switching control transistor, a control electrode thereof connected to the frame reset control terminal, a first electrode thereof connected to the second control voltage terminal, and a second electrode thereof connected to the second pull-down node.

In another aspect, a method of driving the above shift register unit includes: under the control of the frame reset control signal, controlling, by a pull-down node switching control circuit, the first control voltage signal to be written into the first pull-down node, and controlling the second control voltage signal to be written into the second pull-down node.

During implementation, the display period includes a first display sub-period and a second display sub-period, the controlling, by a pull-down node switching control circuit, the first control voltage signal to be written into the first pull-down node, and controlling the second control voltage signal to be written into the second pull-down node under the control of the frame reset control signal includes: in the first display sub-period, the first control voltage signal being a first voltage and the second control voltage signal being a second voltage, during a frame start phase included in the first display sub-period, under the control of the frame reset control signal, the pull-down node switching control circuit controlling the potential at the first pull-down node to be a first voltage, and the potential at the second pull-down node to be a second voltage; and in the second display sub-period, the first control voltage signal being the second voltage, and the second control voltage signal being the first voltage, during a frame start phase included in the second display sub-period, under the control of the frame reset control signal, the pull-down node switching control circuit controlling the potential at the first pull-down node to be a second voltage, and the potential at the second pull-down node to be a first voltage.

During implementation, the method further includes: controlling, by the pull-up node control circuit, the first voltage signal to be written into the pull-up node in the frame start phase included in the first display sub-period and the frame start phase included in the second display sub-period under the control of the frame reset control signal.

During implementation, the display period includes N first display sub-periods and M second display sub-periods, and the first display sub-period and the second display sub-period are alternately arranged, and the a-th first display sub-period and an a-th second display sub-period are sequentially arranged, a time period between the a-th first display sub-period and the a-th second display sub-period comprises the a-th blank period, N, M, and a are positive integers and a<min (N, M), the method of driving the shift register unit further includes: during the a blank phase, controlling the first control voltage signal to be switched from a first voltage to a second voltage, and controlling the second control voltage signal to be switched from the second voltage to the first voltage.

During implementation, N is greater than 1, the a-th second display sub-period and the (a+1)-th first display sub-period are sequentially arranged, a display period between the a-th second display sub-period and the (a+1)-th first display sub-period comprises the (a+1)-th blank phase, and the method of driving the shift register unit further includes: during the (a+1)-th blank phase, controlling the first control voltage signal to be switched from the second voltage to the first voltage, and controlling the second control voltage signal to be switched from the first voltage to the second voltage.

In yet another aspect, a gate driving circuit includes R stages of the above shift register units connected in a cascading manner, wherein R is a positive integer; a carry signal output terminal of the (r+1)-th stage of shift register unit is connected to the reset terminal of the r-th stage of shift register unit, and is connected to the input terminal of the (r+2)-th stage of shift register unit, wherein 1≤r≤R.

In yet another aspect, a display device includes above gate driving circuit.

DETAILED DESCRIPTION

Figure 1:
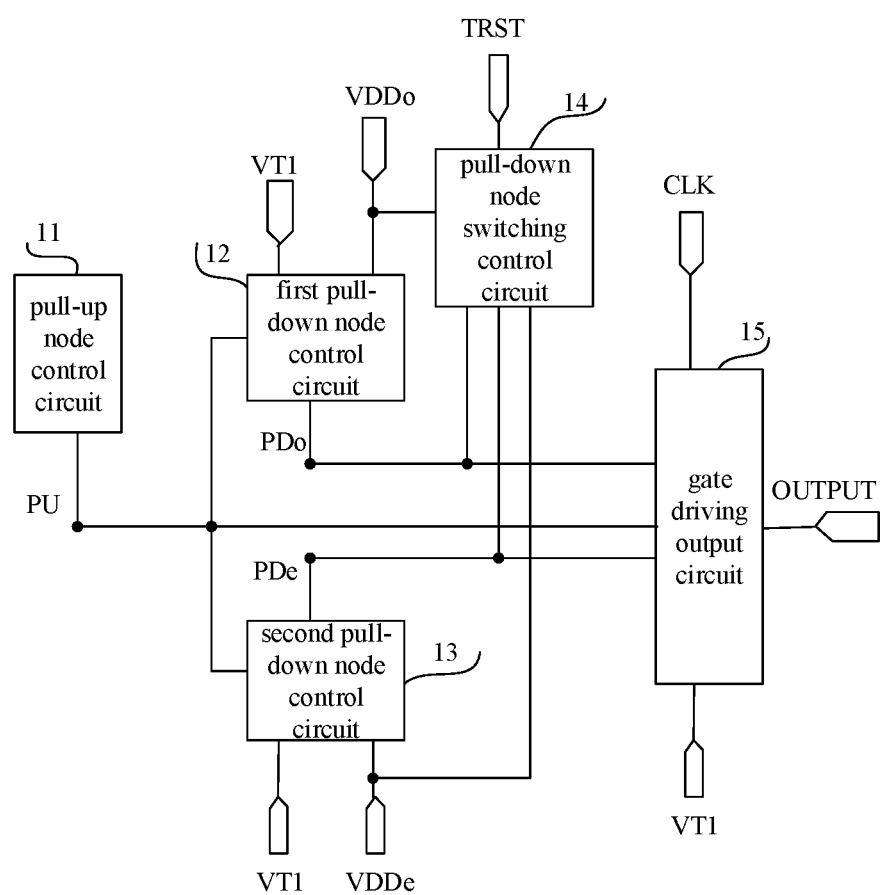
FIG. 1 is a structural diagram of a shift register unit according to an embodiment of the present disclosure.

The technical solutions in the embodiments of the present disclosure will be clearly and completely described below with reference to the accompanying drawings. Obviously, the described embodiments are only a part of the embodiments of the present disclosure, but not all the embodiments. Based on the embodiments in the present disclosure, all other embodiments obtained by a person skilled in the art without creative work fall within the protection scope of the present disclosure. [0036]1 Transistors used in all embodiments of the present disclosure may be thin film transistors or field effect transistors or other devices with the same characteristics. In the embodiment of the present disclosure, in order to distinguish the two electrodes of the transistor other than the control electrode, one electrode is called as a first electrode and the other electrode is called as a second electrode. In actual operation, the control electrode may be a gate electrode, the first electrode may be a drain electrode, and the second electrode may be a source electrode. Alternatively, the control electrode may be a gate electrode, the first electrode may be a source electrode, and the second electrode may be a drain electrode.

When the GOA circuit including two control voltage terminals is operated, the two control voltage terminals are switched between a high voltage and a low voltage during a blank time period between two frames of display images. Through actual product measurement and simulation, when the control voltage signals at the two control voltage terminals are switched from the high voltage to the low voltage, a potential at the gate electrode of the noise reduction transistor corresponding to the control voltage signal (that is, a potential at a pull-down node controlled by the control voltage signal) is slowly decreased, so that potentials at two pull-down nodes are both a high voltage during the display period of a first frame of display image after the control voltage signal is switched between a high voltage and a low voltage, which is equivalent to two noise-reducing signals working at the same time. Since a turning-on current of a TFT becomes smaller at a low temperature, the pull-up node is charged at a slower speed, and the pull-up node is discharged by two noise-reducing signals, a pre-charge time is short for a high resolution and/or a high refresh rate display product, and the potential of the pull-up node cannot be pulled up to a high value during a pre-charge phase. As a result, no gate drive signal is outputted in the GOA circuit during the display time of a first frame of display image after the control voltage signal is switched between the high voltage and the low voltage, resulting in a poor display effect.

The shift register unit, the method of driving the same, the gate driving circuit and the display device provided by the present disclosure can solve the problem in the related art that no gate driving signal is outputted in a gate driving circuit during the display time after the control voltage signal is switched between the high voltage and the low voltage, resulting in poor display effect.

The shift register unit according to an embodiment of the present disclosure includes a pull-up node control circuit, a first pull-down node control circuit, a second pull-down node control circuit, a pull-down node switching control circuit, and a gate driving output circuit.

The pull-up node control circuit is configured to control a potential at the pull-up node. The first pull-down node control circuit is configured to control the potential at the first pull-down node under the control of the voltage signal of the pull-up node and the first control voltage signal. The second pull-down node control circuit is configured to control the potential at the second pull-down node under the control of the voltage signal of the pull-up node and the second control voltage signal. The pull-down node switching control circuit is configured to control the first control voltage signal to be written into the first pull-down node and control the second control voltage signal to be written into the second pull-down node under the control of a frame reset control signal. The gate driving output circuit is configured to control a gate driving signal outputted by the gate driving signal output terminal under the control of a voltage signal of the pull-up node, a voltage signal of the first pull-down node, and a voltage signal of the second pull-down node.

The pull-down node switching control circuit of the shift register unit according to the embodiment of the present disclosure controls the first control voltage signal to be written into a first pull-down node and the second control voltage signal to be written into the second pull-down node under the control of the frame reset control signal. Because when the first control voltage signal is the first voltage, the second control voltage signal is the second voltage, or when the first control voltage signal is the second voltage, the second control voltage signal is the first voltage, so that only one of the potential at the first pull-down node and the potential at the second pull-down node is the second voltage at a time point, thereby avoiding the potentials at the two pull-down nodes being the second voltage at the same time caused during the first control voltage signal and the second control voltage signal being switched between the high voltage and the low voltage, resulting in no gate driving signal being outputted. The shift register unit according to the embodiment of the present disclosure can correctly output a gate driving signal, thereby improving operation reliability.

When the shift register unit according to the embodiment of the present disclosure is applied to a high-resolution display product, a high refresh rate display product, and a display product that needs to work at a lower temperature (such as a car display product), the phenomenon that no gate driving is outputted is efficiently prevented.

In a specific implementation, when the transistor included in the shift register unit according to the embodiment of the present disclosure is an n-type transistor, the first voltage may be a low voltage, and the second voltage may be a high voltage, but this is not limited herein. When the transistor included in the shift register unit according to the embodiment of the present disclosure is a p-type transistor, the first voltage may be a high voltage, and the second voltage may be a low voltage.

In a specific implementation, the pull-up node control circuit is used to control the first voltage signal to be written into the pull-up node under the control of a frame reset control signal; and is used to control the potential at the pull-up node under the control of an input signal and a reset signal, and is also used to control the first voltage signal to be written into the pull-up node under the control of the first pull-down node or the second pull-down node.

More specifically, the pull-up node control circuit is used to control the potential at the pull-up node to be a second voltage under the control of the input signal, and is also used to control the first voltage signal to be written into the pull-up node under the control of the reset signal.

As shown in FIG. 1, the shift register unit according to the embodiment of the present disclosure includes a pull-up node control circuit 11, a first pull-down node control circuit 12, a second pull-down node control circuit 13, a pull-down node switching control circuit 14 and a gate driving output circuit 15.

The pull-up node control circuit 11 is configured to control a potential at the pull-up node PU. The first pull-down node control circuit 12 is connected to a first pull-down node PDo, the pull-up node PU, the first voltage terminal VT1, and a first control voltage terminal, and is used to control the potential at the first pull-down node PDo under the control of a voltage signal of the pull-up node PU and a first control voltage signal VDDo; the first control voltage terminal is used to input the first control voltage signal VDDo. The second pull-down node control circuit 13 is connected to a second pull-down node PDe, the pull-up node PU, the first voltage terminal VT1, and a second control voltage terminal, and is used to control the potential at the second pull-down node PDe under the control of a voltage signal of the pull-up node PU and a second control voltage signal VDDe; the second control voltage terminal is used to input the second control voltage signal VDDe. The pull-down node switching control circuit 14 is connected to a frame reset control terminal TRST, the first pull-down node PDo, the second pull-down node PDe, the first control voltage terminal and the second control voltage terminal, and controls the first pull-down node PDo to be connected to the first control voltage terminal to write the first control voltage signal VDDo into the first pull-down node PDo, and controls the second pull-down node PDe to be connected to the second control voltage terminal to write the second control voltage signal VDDe into the second pull-down node PDe under the control of the frame reset control signal; the frame reset control terminal is used to input the frame reset control signal. The gate driving output circuit 15 is connected to the pull-up node PU, the first pull-down node PDo, the second pull-down node PDe, the gate driving signal output terminal OUTPUT, the clock signal terminal, and the first voltage terminal VT1, and configured to control the gate driving signal output terminal OUTPUT to be connected to the clock signal terminal under the control of the voltage signal of the pull-up node PU, so as to output a clock signal CLK to the gate driving signal output terminal OUTPUT, and control the gate driving signal outputted from the gate driving signal output terminal OUTPUT under the control of the voltage signal of the first pull-down node PDo and the voltage signal of the second pull-down node PDe; the clock signal terminal is used to input the clock signal CLK.

In the embodiment shown in FIG. 1, the first voltage terminal VT1 may be a low voltage terminal for inputting a low voltage VSS, but is not limited thereto.

The pull-down node switching control circuit of the shift register unit shown in FIG. 1 controls the first pull-down node PDo to be connected to the first control voltage terminal VDDo and the second pull-down node PDe to be connected to the second control voltage terminal VDDe under the control of the frame reset control signal inputted by the frame reset control terminal TRST. Only one of VDDo and VDDe is the second voltage at a time point, so as to avoid that no gate driving signal is outputted due to the potentials at the two pull-down nodes being a high level at the same time which is caused by the two control voltage signals being switched between the high voltage and the low voltage.

In specific implementation, when the transistor included in the shift register unit according to the embodiment of the present disclosure is an n-type transistor, the first voltage may be a low voltage and the second voltage may be a high voltage, but this is not limited herein.

In addition, when the shift register unit according to the embodiment of the present disclosure is in operation, the potential at the first pull-down node PDe and the potential at the second pull-down node PDo are alternately changed to a second voltage to control the first output noise reduction transistor whose gate electrode is connected to PDe and the second output noise reduction transistor whose gate electrode is connected to PDo to be turned on alternately, to reduce stress time of the first output noise reduction transistor and stress time of the second output noise reduction transistor while realizing the noise reduction function.

Figure 2:
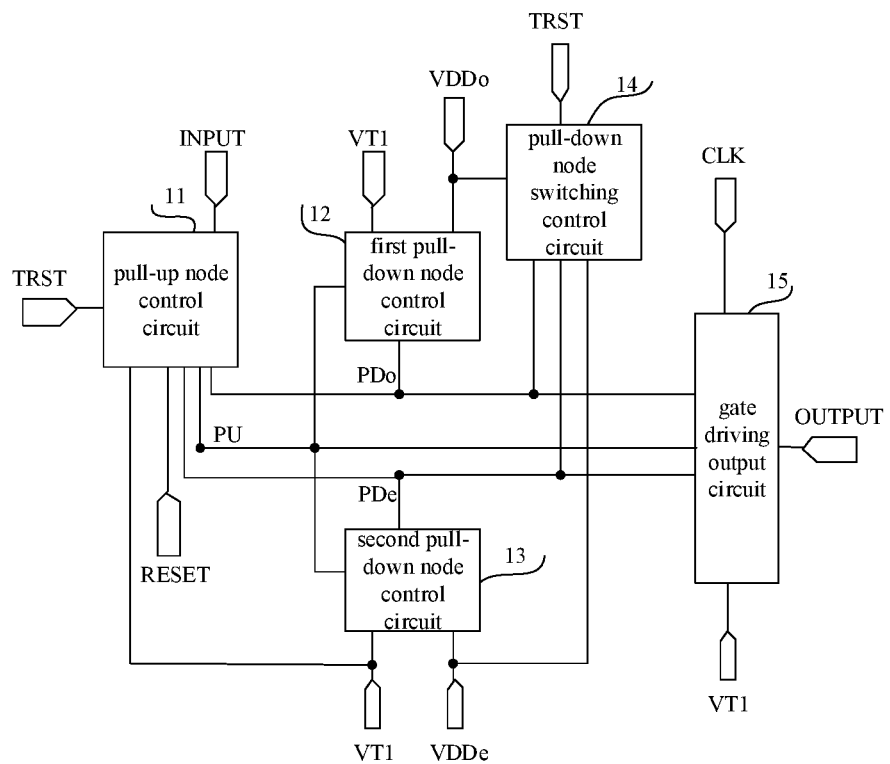
FIG. 2 is another structural diagram of a shift register unit according to an embodiment of the present disclosure.

Based on the shift register unit shown in FIG. 1, as shown in FIG. 2, the pull-up node control circuit 11 is connected to the frame reset control terminal TRST, the input terminal INPUT, the reset terminal RESET, the first pull-down node PDo, the second pull-down node PDe, the pull-up node PU and the first voltage terminal VT1. The pull-up node control circuit 11 is configured to control the pull-up node PU to be connected to the first voltage terminal VT1 under the control of a frame reset control signal, so as to control the first voltage signal to be written into the pull-up node PU. The pull-up node control circuit 11 is further configured to control the potential at the pull-up node PU to a second voltage under the control of an input signal, and control the pull-up node PU to be connected to the first voltage terminal VT1 under the control of a reset signal, so as to write the first voltage signal into the pull-up node PU. The pull-up node control circuit 11 is further configured to control the first voltage signal to be written into the pull-up node PU under the control of the first pull-down node PDo or the second pull-down node PDe. The frame reset control terminal TRST is used to input the frame reset control signal, and the first voltage terminal VT1 is used to input the first voltage signal. The input terminal INPUT is used to input the input signal, and the reset terminal RESET is used to input the reset signal.

In the embodiment shown in FIG. 2, the second voltage may be a high voltage, but is not limited thereto.

In the embodiment of the shift register unit shown in FIG. 2, the pull-up node control circuit 11 controls the pull-up node PU to be connected to the first voltage terminal VT1 under the control of the frame reset control signal, so as to write the first voltage signal into the pull-up node PU to reset the pull-up node PU.

When the shift register unit shown in FIG. 2 is in operation, in an input phase, the pull-up node PU is connected to the input terminal INPUT under the control of an input signal, so that the potential at the pull-up node PU is the second voltage; in a reset phase, the pull-up node PU is connected to the first voltage terminal VT1 under the control of the reset signal, so that the potential at the pull-up node PU is the first voltage.

Optionally, the shift register unit according to the embodiment of the present disclosure may further include a carry output circuit, which is configured to control a clock signal to be outputted to a carry signal output terminal under the control of the voltage signal of the pull-up node; and control the carry signal outputted from the carry signal output terminal under the control of the voltage signal of the first pull-down node and the voltage signal of the second pull-down node.

In specific implementation, the gate driving output circuit is specifically configured to control a clock signal to be outputted to a gate driving signal output terminal under the control of a voltage signal of the pull-up node, and control the gate driving signal outputted from the gate driving signal output terminal under the control of the voltage signal of the first pull-down node and the voltage signal of the second pull-down node.

The shift register unit according to the embodiment of the present disclosure may include a carry output circuit to control the output of a carry signal. An adjacent shift register unit may be reset by the carry signal. The carry signal also provides an input signal to a next-stage of shift register unit, thereby improving the driving capability of the current stage of gate drive signal output terminal.

Figure 3:
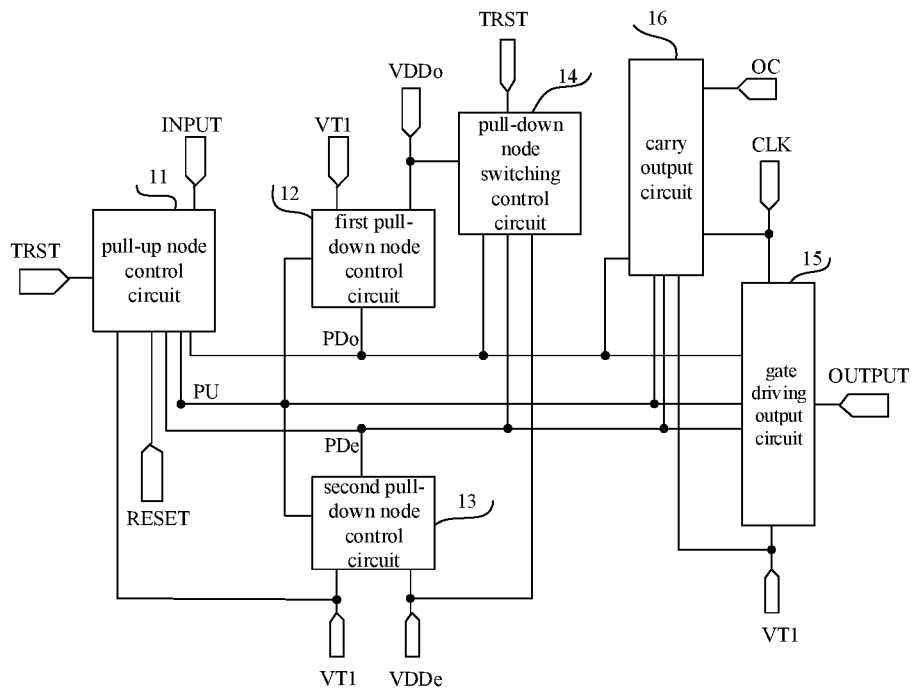
FIG. 3 is yet another structural diagram of a shift register unit according to an embodiment of the present disclosure.

Based on the embodiment of the shift register unit shown in FIG. 2, as shown in FIG. 3, the shift register unit further includes a carry output circuit 16.

The carry output circuit 16 is connected to the pull-up node PU, the first pull-down node PDo, the second pull-down node PDe, a carry signal output terminal OC, a clock signal terminal, and a first voltage terminal VT1. The carry output circuit 16 controls the carry signal output terminal OC to be connected to the clock signal terminal to output a clock signal CLK to the carry signal output terminal OC under the control of the voltage signal of the pull-up node PU, and control the carry signal outputted from the carry signal output terminal OC under the control of the voltage signal of the first pull-down node PDo and the voltage signal of the second pull-down node PDe.

The shift register unit shown in FIG. 3 of the present disclosure includes a carry output circuit 16 for outputting a carry signal. A carry signal output terminal OC provides a reset signal for a previous stage of shift register unit, and provides an input signal to a next stage of shift register unit, so as to improve the driving capability of the gate driving signal output terminal OUTPUT.

Specifically, the pull-down node switching control circuit may include: a first switching control transistor, a control electrode thereof connected to the frame reset control terminal, a first electrode thereof connected to the first control voltage terminal, and a second electrode thereof connected to the first pull-down node; and a second switching control transistor, a control electrode thereof connected to the frame reset control terminal, and a first electrode thereof connected to a second control voltage terminal, and a second electrode thereof connected to the second pull-down node. The frame reset control terminal is used to input the frame reset control signal, the first control voltage terminal is used to input the first control voltage signal, and the second control voltage terminal is used to input the second control voltage signal.

Specifically, the pull-up node control circuit may include: an input transistor, a control electrode and a first electrode thereof connected to the input terminal, and a second electrode thereof connected to the pull-up node; a reset transistor, the control electrode thereof connected to the reset terminal, the first electrode thereof connected to the pull-up node, and the second electrode thereof connected to the first voltage terminal; a frame reset control transistor, a control electrode thereof connected to the frame reset control terminal, a first electrode thereof connected to the pull-up node, and a second electrode thereof connected to the first voltage terminal; a first pull-up node noise reduction transistor, a control electrode thereof connected to the first pull-down node, a first electrode thereof connected to the pull-up node, and a second electrode thereof connected to the first voltage terminal; and a second pull-up node noise reduction transistor, a control electrode thereof connected to the second pull-down node, a first electrode thereof connected to the pull-up node, and a second electrode thereof connected to the first voltage terminal. The input terminal is used to input the input signal, the reset terminal is used to input the reset signal, the frame reset control terminal is used to input the frame reset control signal, and the first voltage terminal is used to input the first voltage signal.

In specific implementation, the first pull-down node control circuit may include a first pull-down control node control sub-circuit and a first pull-down node control sub-circuit. The first pull-down control node control sub-circuit is configured to control the potential at the first pull-down control node under the control of the first control voltage signal and the voltage signal of the pull-up node. The first pull-down node control sub-circuit is configured to control the potential at the first pull-down node under the control of a voltage signal of the first pull-down control node, a voltage signal of the pull-up node, and the first control voltage signal.

Figure 4:
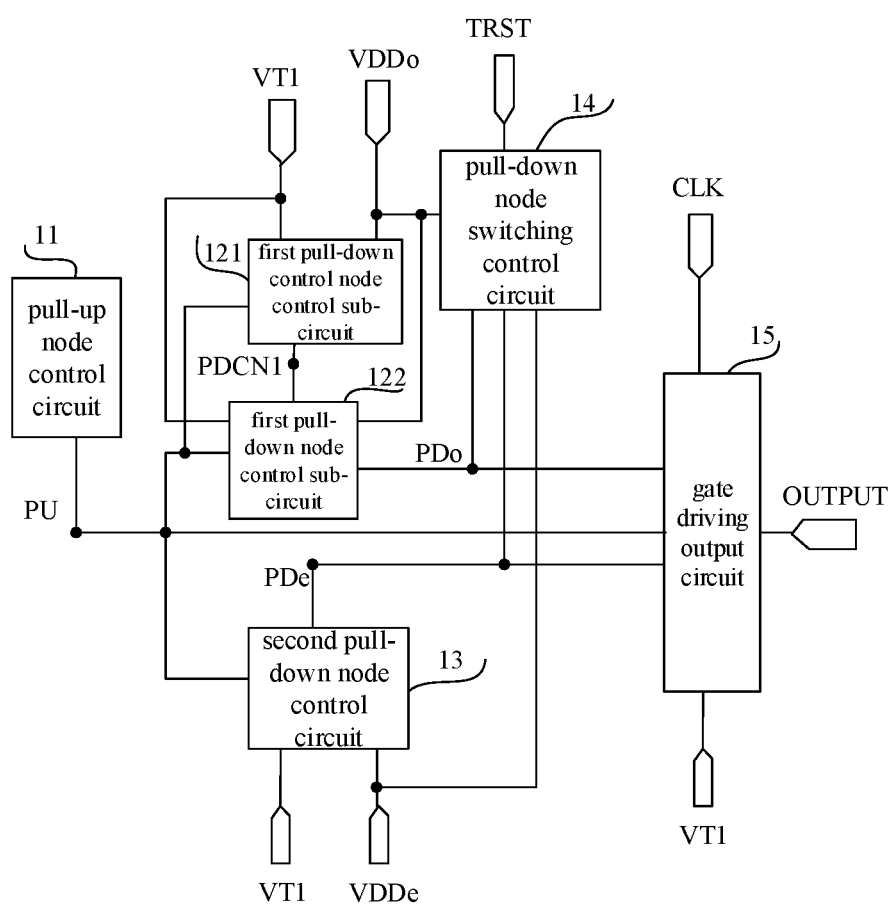
FIG. 4 is still yet another structural diagram of a shift register unit according to an embodiment of the present disclosure.

Based on the embodiment of the shift register unit shown in FIG. 1, as shown in FIG. 4, the first pull-down node control circuit may include a first pull-down control node control sub-circuit 121 and a first pull-down node control sub-circuit 122. The first pull-down control node control sub-circuit 121 is connected to the first control voltage terminal, the first pull-down control node PDCN1, the pull-up node PU, and the first voltage terminal VT1, and is used to control the potential at the first pull-down control node PDCN1 under the control of a first control voltage signal VDDo and a voltage signal of the pull-up node PU. The first pull-down node control sub-circuit 122 is connected to the first pull-down control node PDCN1, the pull-up node PU, the first pull-down node PDo, a first control voltage terminal, and the first voltage terminal VT1, and is used to control the potential at the first pull-down node PDo under the control of a voltage signal of the first pull-down control node PDCN1, a voltage signal of the pull-up node PU, and the first control voltage signal VDDo. The first control voltage terminal is used to input the first control voltage signal VDDo.

Specifically, the first pull-down control node control sub-circuit may include: a first pull-down control transistor, a control electrode and a first electrode thereof connected to the first control voltage terminal, and a second electrode thereof connected to the first pull-down control node; a second pull-down control transistor, a control electrode thereof connected to the pull-up node, a first electrode thereof connected to the first pull-down control node, and a second electrode thereof connected to the first voltage terminal.

The first pull-down node control sub-circuit may include: a third pull-down control transistor, a control electrode thereof connected to the first pull-down control node, a first electrode thereof connected to the first pull-down node, and a second electrode thereof connected to the first control voltage terminal; and a fourth pull-down control transistor, a control electrode thereof connected to the pull-up node, a first electrode thereof connected to the first pull-down node, and a second electrode thereof connected to the first voltage terminal.

In specific implementation, the second pull-down node control circuit may include a second pull-down control node control sub-circuit and a second pull-down node control sub-circuit. The second pull-down control node control sub-circuit is configured to control a potential at a second pull-down control node under the control of the second control voltage signal and the voltage signal of the pull-up node. The second pull-down node control sub-circuit is configured to control the potential at the second pull-down node under the control of a voltage signal of the second pull-down control node, a voltage signal of the pull-up node, and the second control voltage signal.

Figure 5:
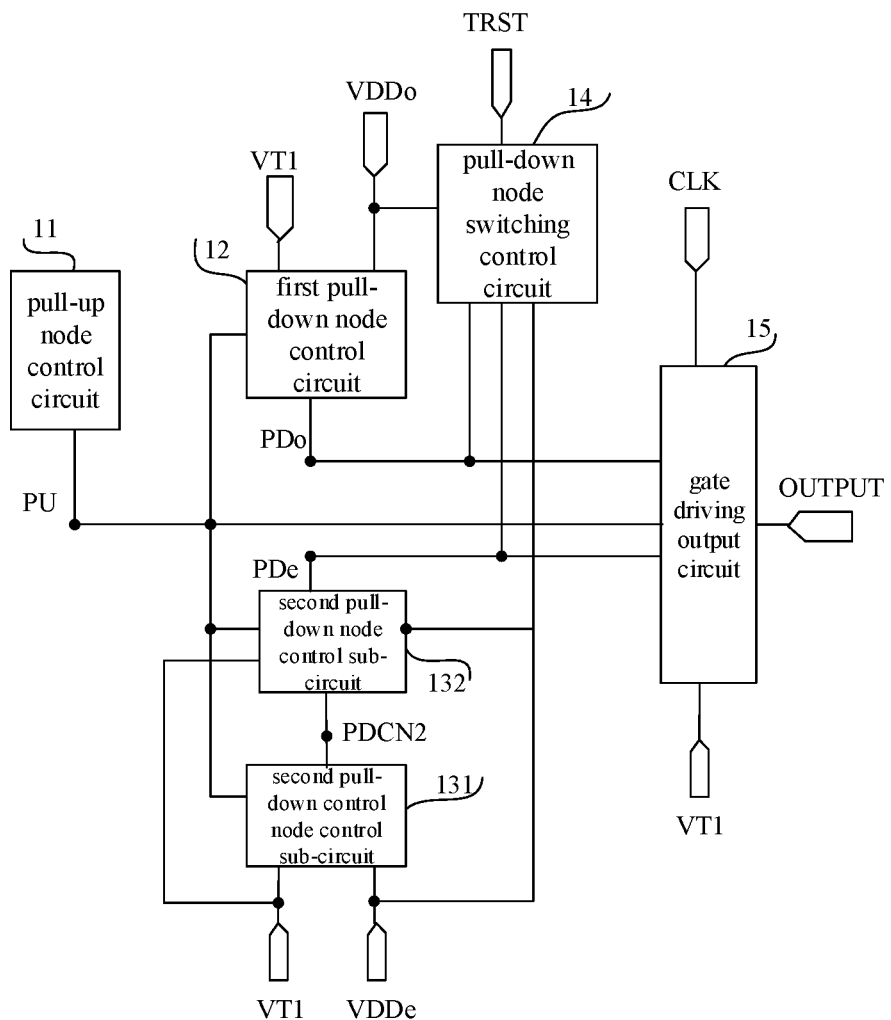
FIG. 5 is still yet another structural diagram of a shift register unit according to an embodiment of the present disclosure.

Based on the embodiment of the shift register unit shown in FIG. 1, as shown in FIG. 5, the second pull-down node control circuit may include a second pull-down control node control sub-circuit 131 and a second pull-down node control sub-circuit 132. The second pull-down control node control sub-circuit 131 is connected to the second control voltage terminal, a second pull-down control node PDCN2, the pull-up node PU and the first voltage terminal VT1, and is configured to control the potential at the second pull-down control node PDCN2 under the control of a second control voltage signal VDDe and a voltage signal of the pull-up node PU. The second pull-down node control sub-circuit 132 is connected to the second pull-down control node PDCN2, the pull-up node PU, the second pull-down node PDe, a second control voltage terminal, and the first voltage terminal VT1, and configured to control the potential at the second pull-down node PDe under the control of a voltage signal of the second pull-down control node PDCN2, a voltage signal of the pull-up node PU, and the second control voltage signal VDDe. The second control voltage terminal is used to input the second control voltage signal VDDe.

Specifically, the second pull-down control node control sub-circuit may include: a fifth pull-down control transistor, the control electrode and the first electrode thereof connected to a second control voltage terminal, and the second electrode thereof connected to the second pull-down control node; and a sixth pull-down control transistor, a control electrode thereof connected to the pull-up node, a first electrode thereof connected to the second pull-down control node, and a second electrode thereof connected to the first voltage terminal. The second pull-down node control sub-circuit includes: a seventh pull-down control transistor, a control electrode thereof connected to the second pull-down control node, a first electrode thereof connected to the second pull-down node, and a second electrode thereof connected to a second control voltage terminal; and an eighth pull-down control transistor, a control electrode thereof connected to the pull-up node, a first electrode thereof connected to the second pull-down node, and a second electrode thereof connected to the first voltage terminal.

In specific implementation, the gate driving output circuit may include: a gate driving output transistor, a control electrode thereof connected to the pull-up node, a first electrode thereof connected to a clock signal terminal, and a second electrode thereof connected to a gate driving signal output terminal; a storage capacitor, a first terminal thereof connected to the pull-up node, and a second terminal thereof connected to the gate driving signal output terminal; a first output noise reduction transistor, a control electrode thereof connected to the first pull-down node, a first electrode thereof connected to the gate driving signal output terminal, and a second electrode thereof connected to a first voltage terminal; and a second output noise reduction transistor, a control electrode thereof connected to the second pull-down node, a first electrode thereof connected to the gate driving signal output terminal, and a second electrode thereof connected to the first voltage terminal.

In specific implementation, the carry output circuit may include: a first carry output transistor, a control electrode thereof connected to the pull-up node, a first electrode thereof connected to a clock signal terminal, and a second electrode thereof connected to the carry signal output terminal; a second carry output transistor, a control electrode thereof connected to the first pull-down node, a first electrode thereof connected to the carry signal output terminal, and a second electrode thereof connected to a first voltage terminal; and a third carry output transistor, a control electrode thereof connected to the second pull-down node, a first electrode thereof connected to the carry signal output terminal, and a second electrode thereof connected to the first voltage terminal.

Specifically, the pull-down node switching control circuit 14 may include: a first switching control transistor, a control electrode thereof connected to the frame reset control terminal, a first electrode thereof connected to the first control voltage terminal, and a second electrode thereof connected to the first pull-down node; and a second switching control transistor, a control electrode thereof connected to the frame reset control terminal, a first electrode thereof connected to the second control voltage terminal, and a second electrode thereof connected to the second pull-down node.

Figure 6:
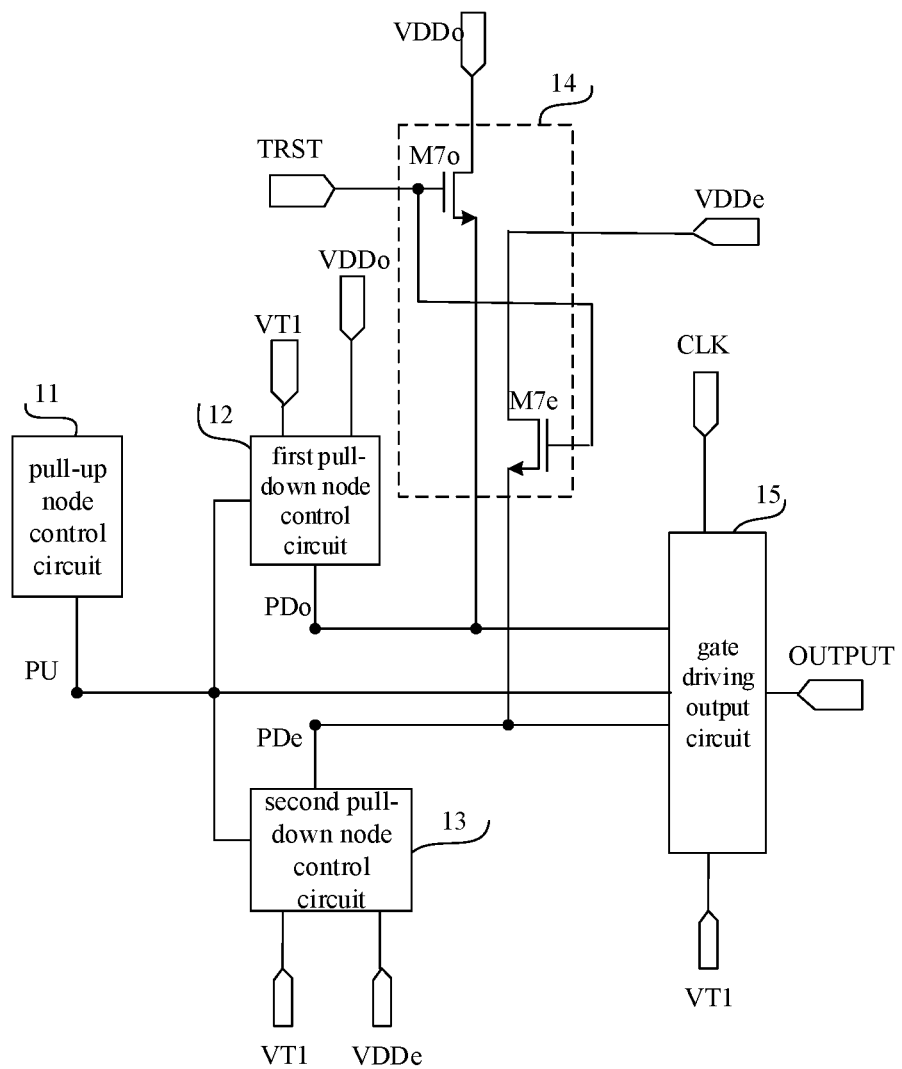
FIG. 6 is still yet another structural diagram of a shift register unit according to an embodiment of the present disclosure.

Based on the embodiment of the shift register unit shown in FIG. 1, as shown in FIG. 6, the pull-down node switching control circuit 14 includes: a first switching control transistor M7$o$, a gate electrode thereof connected to the frame reset control terminal TRST, a drain electrode thereof connected to the first control voltage terminal, and a source electrode thereof connected to the first pull-down node PD$o$; and a second switching control transistor M7$e$, a gate electrode thereof connected to the frame reset control terminal TRST, a drain electrode thereof connected to the second control voltage terminal, and a source electrode thereof connected to the second pull-down node PD$e$. The first control voltage terminal is used to input a first control voltage signal VDD$o$, and the second control voltage terminal is used to input a second control voltage signal VDD$e$.

In the embodiment shown in FIG. 6, M7$o$ and M7$e$ are both n-type TFTs, but not limited thereto.

In the embodiment shown in FIG. 6, when TRST outputs a high level, both M7$o$ and M7$e$ are turned on to write the first control voltage signal VDD$o$ into the first pull-down node PD$o$ and write the second control voltage signal VDD$e$ into the second pull-down node PD$e$.

In actual operation, the time period between two adjacent display sub-periods includes a frame end phase, a blank phase, and a frame start phase, which are sequentially set. During the blank phase, VDD$o$ and VDD$e$ are switched between the high voltage and the low voltage (for example, VDD$o$ switches from the high voltage to the low voltage, VDD$e$ switches from the low voltage to the high voltage, or VDD$o$ switches from the low voltage to the high voltage, and VDD$e$ switches from the high voltage to the low voltage). In general, during the frame end phase and the frame start phase, TRST outputs a high level to control both M7$o$ and M7$e$ to be turned on, so that one of the potential of PD$e$ and the potential of PD$o$ is the high voltage, avoiding the situation that the potentials of the two pull-down nodes are both a high level when the scan is started in the first frame after the two control voltage signals are switched between the high level and the low level, resulting in no gate drive signal being outputted. In the embodiment of the present disclosure, the shift register unit may ensure that only one of the potentials of the two pull-down nodes is a high level when the scan is started in the first frame after the two control voltage signals are switched between the high level and the low level, thereby speeding up the charging of the pull-up node PU, and pulling up the potential of PU to a relative high level within the pre-charge phase, to implement noise reduction to the pull-down node and output the gate driving signal normally, so as to enhance the reliability of the display product operated at a low temperature.

In a specific implementation, the display sub-period may include at least one frame of display time, for example, the duration of the display sub-period may be 2 seconds, but is not limited thereto.

A shift register unit according to the present disclosure is described as follows through a specific example.

Figure 7:
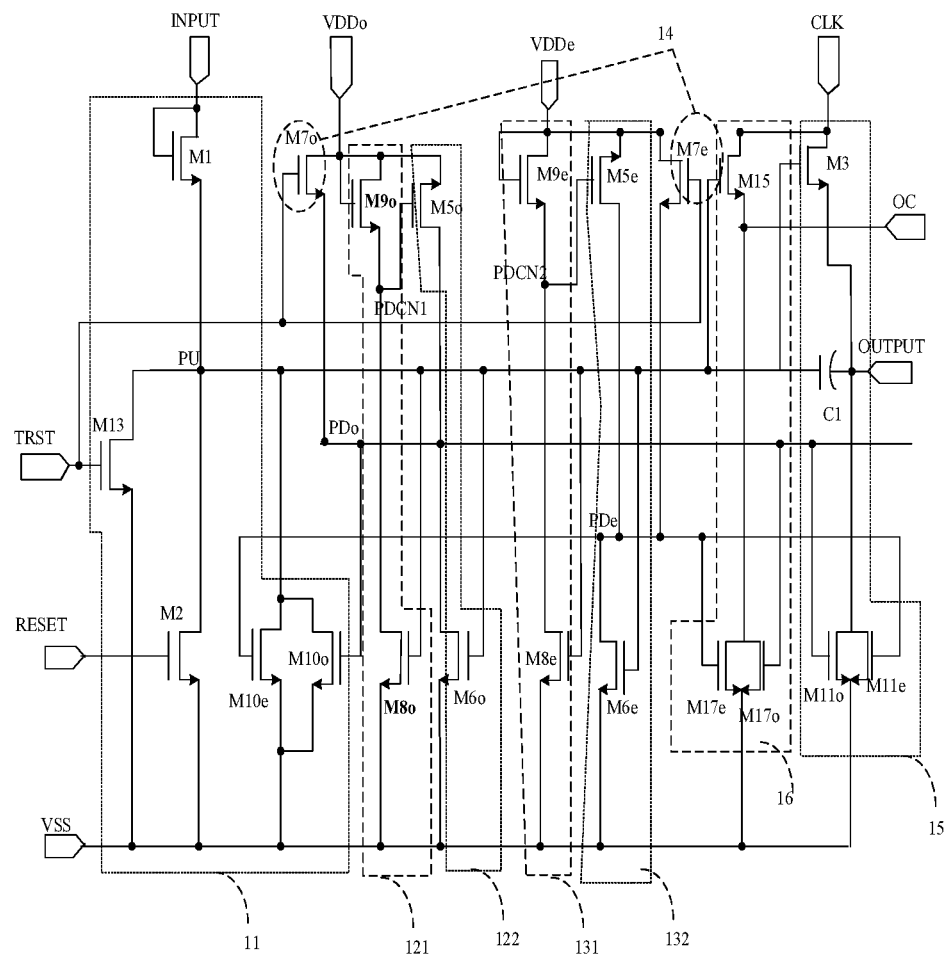
FIG. 7 is a circuit diagram of a shift register unit according to an embodiment of the present disclosure.

As shown in FIG. 7, the shift register unit includes a pull-up node control circuit 11, a first pull-down node control circuit 12, a second pull-down node control circuit 13, a pull-down node switching control circuit 14, a gate driving output circuit 15 and a carry output circuit 16. The pull-up node control circuit 11 includes: an input transistor M1, the gate electrode and the drain electrode thereof connected to the input terminal INPUT, and the source electrode thereof connected to the pull-up node PU; a reset transistor M2, a gate electrode thereof connected to the reset terminal RESET, a drain electrode thereof connected to the pull-up node PU, and a source electrode thereof connected to the low voltage VSS; a frame reset control transistor M13, a gate electrode thereof connected to the frame reset control terminal TRST, a drain electrode thereof connected to the pull-up node PU, and a source electrode thereof connected to the low voltage VSS; a first pull-up node noise reduction transistor M10$o$, a gate electrode thereof connected to the first pull-down node PD$o$, a drain electrode thereof connected to the pull-up node PU, and a source electrode thereof connected to the low voltage VSS; and a second pull-up node noise reduction transistor M10e, a gate electrode thereof connected to the second pull-down node PDe, a drain electrode thereof connected to the pull-up node PU, and a source electrode thereof connected to the low voltage VSS.

The first pull-down node control circuit 12 includes a first pull-down control node control sub-circuit 121 and a first pull-down node control sub-circuit 122. The first pull-down control node control sub-circuit 121 includes: a first pull-down control transistor M9o, a gate electrode and a drain electrode thereof connected to the first control voltage terminal, and a source electrode thereof connected to the first pull-down control node PDCN1, a first control voltage terminal being used to input a first control voltage Signal VDDo; and a second pull-down control transistor M8o, a gate electrode thereof connected to the pull-up node PU, a drain electrode thereof connected to the first pull-down control node PDCN1, and a source electrode thereof connected to the low voltage VSS. The first pull-down node control sub-circuit 122 includes: a third pull-down control transistor M5o, a gate electrode thereof connected to the first pull-down control node PDCN1, a drain electrode thereof connected to the first pull-down node PDo, and a source electrode thereof connected to the first control voltage terminal; and a fourth pull-down control transistor M6o, a gate electrode thereof connected to the pull-up node PU, a drain electrode thereof connected to the first pull-down node PDo, and a source electrode thereof connected to the low voltage VSS.

The second pull-down node control circuit 13 includes a second pull-down node control sub-circuit 131 and a second pull-down node control sub-circuit 132. The second pull-down control node control sub-circuit 131 includes: a fifth pull-down control transistor M9e, the gate electrode and the drain electrode thereof connected to a second control voltage terminal, and the source electrode thereof connected to the second pull-down control node, the second control voltage terminal being used to input a second control voltage signal VDDe; a sixth pull-down control transistor M8e, a gate electrode thereof connected to the pull-up node PU, a drain electrode thereof connected to the second pull-down control node PDCN2, and a source electrode thereof connected to the low voltage VSS. The second pull-down node control sub-circuit 132 includes: a seventh pull-down control transistor M5e, a gate electrode thereof connected to the second pull-down control node PDCN2, a drain electrode thereof connected to the second pull-down node PDe, and a source electrode thereof connected to the second control voltage terminal; and an eighth pull-down control transistor M6e, a gate electrode thereof connected to the pull-up node PU, a drain electrode thereof connected to the second pull-down node PDe, and a source electrode thereof connected to the low voltage VSS.

The pull-down node switching control circuit 14 includes: a first switching control transistor M7o, a gate electrode thereof connected to the frame reset control terminal TRST, a drain electrode thereof connected to the first control voltage terminal, and a source electrode thereof connected to the first pull-down node PDo; and a second switching control transistor M7e, a gate electrode thereof connected to the frame reset control terminal TRST, a drain electrode thereof connected to the second control voltage terminal, and a source electrode thereof connected to the second pull-down node PDe. The gate driving output circuit 15 includes: a gate driving output transistor M3, a gate electrode thereof connected to the pull-up node PU, a drain electrode thereof connected to the clock signal terminal, and a source electrode thereof connected to the gate drive signal output terminal OUTPUT, the clock signal terminal being used to input a clock signal CLK; a storage capacitor C1, the first terminal thereof connected to the pull-up node PU, and the second terminal thereof connected to the gate driving signal output terminal OUTPUT; a first output noise reduction transistor M11o, a gate electrode thereof connected to the first pull-down node PDo, a drain electrode thereof connected to the gate driving signal output terminal OUTPUT, and a source electrode thereof connected to a low voltage VSS; and a second output noise reduction transistor Mile, a gate electrode thereof connected to the second pull-down node PDe, a drain electrode thereof connected to the gate driving signal output terminal, and a source electrode thereof connected to the low voltage VSS.

The carry output circuit 16 includes: a first carry output transistor M15, a gate electrode thereof connected to the pull-up node PU, a drain electrode thereof connected to the clock signal terminal, and a source electrode thereof connected to the carry signal output terminal OC; a second carry output transistor M17o, a gate electrode thereof connected to the first pull-down node PDo, a drain electrode thereof connected to the carry signal output terminal OC, and a source electrode thereof connected to a low voltage VSS; and a third carry output transistor M17e, a gate electrode thereof connected to the second pull-down node PDe, a drain electrode thereof connected to the carry signal output terminal OC, and a source electrode thereof connected to the low voltage terminal VSS.

In the specific embodiment shown in FIG. 7, all transistors are n-type TFTs, but not limited thereto.

Figures 8, 9:
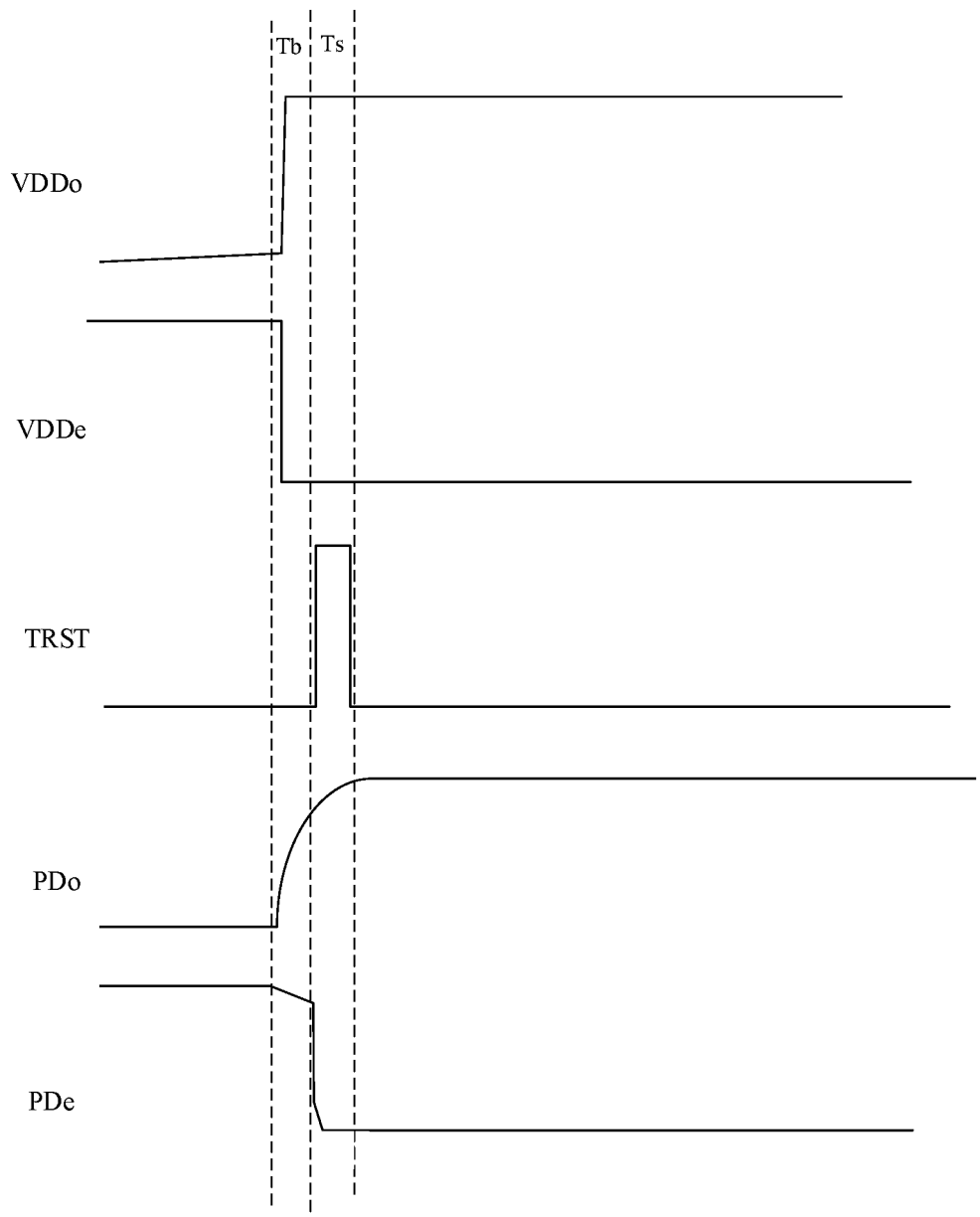
FIG. 8 is a time sequence diagram of an operation of a gate driving circuit including the shift register unit shown in FIG. 7 according to an embodiment of the present disclosure.
FIG. 9 is a flowchart of a method of driving a shift register unit according to an embodiment of the present disclosure.

As shown in FIG. 8, when a gate driving circuit including the shift register unit shown in FIG. 7 is in operation, VDDe is switched from the low voltage to the high voltage during a blank phase Tb between two display sub-periods. VDDe is switched from the high voltage to the low voltage and VDDo is switched from the low voltage to the high voltage. In the frame start phase Ts between two display sub-periods and after the blank phase Tb, the frame reset control signal outputted from TRST is a high voltage, so as to control M7o and M7e to be turned on, PDo to be connected to VDDo, PDe to be connected to VDDe, the potential of PDe to be a low voltage, and the potential of PDo to be a high voltage, so that after the frame start phase Ts is end and a next display sub-period is started, when the scan is started to the first frame, a corresponding stage of shift register unit can output the gate driving signal normally.

The method of driving a shift register unit according to the embodiment of the present disclosure is applied to the above-mentioned shift register unit. The method of driving the shift register unit includes step S1: under the control of the frame reset control signal, controlling, by the pull-down node switching control circuit, the first control voltage signal to be written into the first pull-down node, and controlling the second control voltage signal to be written into the second pull-down node.

In the method of driving the shift register unit according to the embodiment of the present disclosure, under the control of a frame reset control signal, the pull-down node switching control circuit controls a first control voltage signal to be written into a first pull-down node and controls a second control voltage signal to be written into the second pull-down node. Since when the first control voltage signal is the first voltage, the second control voltage signal is the second voltage, or when the first control voltage signal is the second voltage, the second control voltage signal is the first voltage, only one of the potential at the first pull-down node and the potential at the second pull-down node is the second voltage at a time point, thereby avoiding the problem that potentials at the two pull-down nodes are the second voltage at the same time when the first control voltage signal and the second control voltage signal are switched between the high voltage and the low voltage, resulting in no gate driving signal is output.

In specific implementation, the display period may include a first display sub-period and a second display sub-period. Step S1 of the method of driving the shift register unit specifically includes: in the first display sub-period, the first control voltage signal being a first voltage and the second control voltage signal being a second voltage, during the frame start phase included in the first display sub-period, under the control of the frame reset signal, the pull-down node switching control circuit controlling the potential at the first pull-down node to be a first voltage, and the potential at the second pull-down node to be a second voltage; in the second display sub-period, the first control voltage signal being a second voltage, and the second control voltage signal being a first voltage, during a frame start phase included in the second display sub-period, under the control of the frame reset control signal, the pull-down node switching control circuit controlling the potential at the first pull-down node to be a second voltage, and the potential at the second pull-down node to be a first voltage.

Specifically, the method of driving the shift register unit further includes: controlling, by the pull-up node control circuit, the first voltage signal to be written into the pull-up node to reset the pull-up node in the frame start phase included in the first display sub-period and the frame start phase included in the second display sub-period under the control of the frame reset control signal.

In actual operation, the display period may specifically include N first display sub-periods and M second display sub-periods, and the first display sub-period and the second display sub-period are alternately arranged, and the a-th first display sub-period and an a-th second display sub-period are sequentially arranged. The time period between the a-th first display sub-period and the a-th second display sub-period includes the a-th blank period, N, M, and a are positive integers and a<min (N, M), the method of driving the shift register unit further includes: during the a blank phase, controlling the first control voltage signal to be switched from a first voltage to a second voltage, and controlling the second control voltage signal to be switched from the second voltage to the first voltage.

In specific implementation, N is greater than 1, the a-th second display sub-period and the (a+1)-th first display sub-period are sequentially arranged, the display period between the a-th second display sub-period and the (a+1)-th first display sub-period includes an (a+1)-th blank phase, and the method of driving the shift register unit further includes: during the (a+1)-th blank phase, controlling the first control voltage signal to be switched from the second voltage to the first voltage, and controlling the second control voltage signal to be switched from the first voltage to the second voltage.

In specific implementation, when the transistors included in the shift register unit according to the embodiments of the present disclosure are all n-type transistors, the first voltage may be a low voltage and the second voltage may be a high voltage, but is not limited thereto.

When transistors included in the shift register unit according to the embodiment of the present disclosure are p-type transistors, the first voltage may be a high voltage, and the second voltage may be a low voltage.

The gate driving circuit according to the embodiment of the present disclosure includes R stages of the above-mentioned shift register units connected in a cascading manner, where R is a positive integer.

Specifically, the carry signal output terminal OC of the (r+1)-th stage of shift register unit in the gate driving circuit of the embodiment of the present disclosure is connected to the reset terminal RESET of the r-th stage of shift register unit, and is connected to the input terminal INPUT of the (r+2)-th stage of shift register unit, where $1 \leq r \leq R$.

In the embodiment of the present disclosure, the carry signal output terminal OC provides a reset signal for an adjacent previous stage of shift register unit and an input signal for an adjacent next stage of shift register unit to improve the drive capability of the gate driving signal output terminal OUTPUT.

The display device according to the embodiment of the present disclosure includes the gate driving circuit described above.

The shift register unit, the method of driving the same, the gate driving circuit and the pull-down node switching control circuit in the present disclosure control the first control voltage signal to be written into the first pull-down node and the second control voltage single to be written into the second pull-down node under the control of the frame reset control signal. When the first control voltage signal is the first voltage, the second control voltage signal is the second voltage, or when the first control voltage signal is the second voltage, the second control voltage signal is the first voltage, only one of the potentials of the first pull-down node and the potential of the second pull-down node is the second voltage at a time point, thereby avoiding the problem that the potentials of the two pull-down nodes are the second voltage at the same time when the first control voltage signal and the second control voltage signal are switched between the high voltage and the low voltage, resulting in no gate driving signal is output, so that the gate driving signal can be output correctly, and the operation reliability is improved.

The display device provided in the embodiments of the present disclosure may be any product or component having a display function, such as a mobile phone, a tablet computer, a television, a display, a notebook computer, a digital photo frame, a navigator, and the like.

The above descriptions merely describe optional implementations of the present disclosure. It is appreciated, modifications and improvements may be made by a person of ordinary skill in the art without departing from the principle of the present disclosure, and these modifications and improvements shall fall within the scope of the present disclosure.

What is claimed is:
1. A shift register unit, comprising:
a pull-up node control circuit, a first pull-down node control circuit, a second pull-down node control circuit, a pull-down node switching control circuit, and a gate driving output circuit, wherein
the pull-up node control circuit is configured to control a potential at a pull-up node;
the first pull-down node control circuit is configured to control a potential at a first pull-down node under the control of a voltage signal of the pull-up node and a first control voltage signal;
the second pull-down node control circuit is configured to control a potential at a second pull-down node under the control of the voltage signal of the pull-up node and a second control voltage signal;

the pull-down node switching control circuit is configured to control the first control voltage signal to be written into the first pull-down node and control the second control voltage signal to be written into the second pull-down node under the control of a frame reset control signal; and the gate driving output circuit is configured to control a gate driving signal outputted by a gate driving signal output terminal under the control of the voltage signal of the pull-up node, the voltage signal of the first pull-down node, and the voltage signal of the second pull-down node, wherein the first pull-down node control circuit is connected to the first pull-down node, the pull-up node, the first voltage terminal, and a first control voltage terminal, the first control voltage terminal is used to input the first control voltage signal;

the second pull-down node control circuit is connected to a second pull-down node, the pull-up node, the first voltage terminal, and a second control voltage terminal, the second control voltage terminal is used to input the second control voltage signal;

the pull-down node switching control circuit is connected to a frame reset control terminal, the first pull-down node, the second pull-down node, the first control voltage terminal and the second control voltage terminal, and controls the first pull-down node to be connected to the first control voltage terminal to write the first control voltage signal into the first pull-down node, and controls the second pull-down node to be connected to the second control voltage terminal to write the second control voltage signal into the second pull-down node under the control of the frame reset control signal, the frame reset control terminal is used to input the frame reset control signal; and the gate driving output circuit is connected to the pull-up node, the first pull-down node, the second pull-down node, a gate driving signal output terminal, a clock signal terminal, and the first voltage terminal, and configured to control the gate driving signal output terminal to be connected to the clock signal terminal under the control of the voltage signal of the pull-up node, so as to output the clock signal to the gate driving signal output terminal, and control the gate driving signal outputted from the gate driving signal output terminal under the control of the voltage signal of the first pull-down node and the voltage signal of the second pull-down node, the clock signal terminal is used to input the clock signal.

2. The shift register unit according to claim 1, wherein the pull-up node control circuit is configured to control the first voltage signal to be written into the pull-up node under the control of a frame reset control signal, control a potential at the pull-up node under the control of an input signal and a reset signal, and control the first voltage signal to be written into the pull-up node under the control of the first pull-down node or the second pull-down node;

the pull-up node control circuit is further configured to control the potential at the pull-up node to be a second voltage under the control of the input signal, and control the first voltage signal to be written into the pull-up node under the control of the reset signal.

3. The shift register unit according to claim 2, wherein the pull-up node control circuit is connected to the frame reset control terminal, the input terminal, the reset terminal, the first pull-down node, the second pull-down node, the pull-up node and the first voltage terminal;

the pull-up node control circuit is configured to control the pull-up node to be connected to the first voltage terminal under the control of a frame reset control signal, so as to control the first voltage signal to be written into the pull-up node PU; control the potential at the pull-up node to a second voltage under the control of an input signal; control the pull-up node to be connected to the first voltage terminal under the control of a reset signal, so as to write the first voltage signal into the pull-up node; and control the first voltage signal to be written into the pull-up node under the control of the first pull-down node or the second pull-down node;

the first voltage terminal is used to input the first voltage signal; and the input terminal is used to input the input signal, and the reset terminal is used to input the reset signal.

4. The shift register unit according to claim 1, further comprising a carry output circuit, wherein the carry output circuit is connected to the pull-up node, the first pull-down node, the second pull-down node, a carry signal output terminal, a clock signal terminal, and a first voltage terminal, and configured to control a clock signal to be outputted to a carry signal output terminal under the control of the voltage signal of the pull-up node; and control the carry signal outputted from the carry signal output terminal under the control of the voltage signal of the first pull-down node and the voltage signal of the second pull-down node.

5. The shift register unit according to claim 1, wherein the pull-down node switching control circuit comprises:

a first switching control transistor, a control electrode thereof connected to the frame reset control terminal, a first electrode thereof connected to the first control voltage terminal, and a second electrode thereof connected to the first pull-down node; and a second switching control transistor, a control electrode thereof connected to the frame reset control terminal, and a first electrode thereof connected to a second control voltage terminal, and a second electrode thereof connected to the second pull-down node.

6. The shift register unit according to claim 1, wherein the pull-up node control circuit comprises:

an input transistor, a control electrode and a first electrode thereof connected to the input terminal, and a second electrode thereof connected to the pull-up node;

a reset transistor, a control electrode thereof connected to the reset terminal, a first electrode thereof connected to the pull-up node, and a second electrode thereof connected to the first voltage terminal;

a frame reset control transistor, a control electrode thereof connected to the frame reset control terminal, a first electrode thereof connected to the pull-up node, and a second electrode thereof connected to the first voltage terminal;

a first pull-up node noise reduction transistor, a control electrode thereof connected to the first pull-down node, a first electrode thereof connected to the pull-up node, and a second electrode thereof connected to the first voltage terminal; and a second pull-up node noise reduction transistor, a control electrode thereof connected to the second pull-down node, a first electrode thereof connected to the pull-up node, and a second electrode thereof connected to the first voltage terminal;

the input terminal is used to input the input signal, the reset terminal is used to input the reset signal, the frame reset control terminal is used to input the frame reset control signal, and the first voltage terminal is used to input the first voltage signal.

7. The shift register unit according to claim 1, wherein the first pull-down node control circuit comprises a first pull-down control node control sub-circuit and a first pull-down node control sub-circuit,
the first pull-down control node control sub-circuit is connected to the first control voltage terminal, the first pull-down control node, the pull-up node, and the first voltage terminal, and configured to control the potential at the first pull-down control node under the control of a first control voltage signal and a voltage signal of the pull-up node;
the first pull-down node control sub-circuit is connected to the first pull-down control node, the pull-up node, the first pull-down node, a first control voltage terminal, and the first voltage terminal, and is configured to control the potential at the first pull-down node under the control of a voltage signal of the first pull-down control node, a voltage signal of the pull-up node, and the first control voltage signal.

8. The shift register unit according to claim 7, wherein the first pull-down control node control sub-circuit comprises:
a first pull-down control transistor, a control electrode and a first electrode thereof connected to the first control voltage terminal, and a second electrode thereof connected to the first pull-down control node;
a second pull-down control transistor, a control electrode thereof connected to the pull-up node, a first electrode thereof connected to the first pull-down control node, and a second electrode thereof connected to the first voltage terminal;
the first pull-down node control sub-circuit comprises:
a third pull-down control transistor, a control electrode thereof connected to the first pull-down control node, a first electrode thereof connected to the first pull-down node, and a second electrode thereof connected to the first control voltage terminal; and
a fourth pull-down control transistor, a control electrode thereof connected to the pull-up node, a first electrode thereof connected to the first pull-down node, and a second electrode thereof connected to the first voltage terminal.

9. The shift register unit according to claim 1, wherein the second pull-down node control circuit comprises a second pull-down control node control sub-circuit and a second pull-down node control sub-circuit,
the second pull-down control node control sub-circuit is connected to the second control voltage terminal, a second pull-down control node, the pull-up node and the first voltage terminal, and is configured to control the potential at the second pull-down control node under the control of a second control voltage signal and a voltage signal of the pull-up node;
the second pull-down node control sub-circuit is connected to the second pull-down control node, the pull-up node, the second pull-down node, a second control voltage terminal, and the first voltage terminal, and configured to control the potential at the second pull-down node under the control of a voltage signal of the second pull-down control node, a voltage signal of the pull-up node, and the second control voltage signal.

10. The shift register unit according to claim 9, wherein the second pull-down control node control sub-circuit comprises:
a fifth pull-down control transistor, a control electrode and a first electrode thereof connected to the second control voltage terminal, and a second electrode thereof connected to the second pull-down control node; and
a sixth pull-down control transistor, a control electrode thereof connected to the pull-up node, a first electrode thereof connected to the second pull-down control node, and a second electrode thereof connected to the first voltage terminal;
the second pull-down node control sub-circuit comprises:
a seventh pull-down control transistor, a control electrode thereof connected to the second pull-down control node, a first electrode thereof connected to the second pull-down node, and a second electrode thereof connected to a second control voltage terminal; and
an eighth pull-down control transistor, a control electrode thereof connected to the pull-up node, a first electrode thereof connected to the second pull-down node, and a second electrode thereof connected to the first voltage terminal.

11. The shift register unit according to claim 1, wherein the gate driving output circuit comprises:
a gate driving output transistor, a control electrode thereof connected to the pull-up node, a first electrode thereof connected to a clock signal terminal, and a second electrode thereof connected to a gate driving signal output terminal;
a storage capacitor, a first terminal thereof connected to the pull-up node, and a second terminal thereof connected to the gate driving signal output terminal;
a first output noise reduction transistor, a control electrode thereof connected to the first pull-down node, a first electrode thereof connected to the gate driving signal output terminal, and a second electrode thereof connected to a first voltage terminal; and
a second output noise reduction transistor, a control electrode thereof connected to the second pull-down node, a first electrode thereof connected to the gate driving signal output terminal, and a second electrode thereof connected to the first voltage terminal.

12. The shift register unit according to claim 4, wherein the carry output circuit comprises:
a first carry output transistor, a control electrode thereof connected to the pull-up node, a first electrode thereof connected to a clock signal terminal, and a second electrode thereof connected to the carry signal output terminal;
a second carry output transistor, a control electrode thereof connected to the first pull-down node, a first electrode thereof connected to the carry signal output terminal, and a second electrode thereof connected to a first voltage terminal; and
a third carry output transistor, a control electrode thereof connected to the second pull-down node, a first electrode thereof connected to the carry signal output terminal, and a second electrode thereof connected to the first voltage terminal.

13. The shift register unit according to claim 1, wherein the pull-down node switching control circuit comprises:
a first switching control transistor, a control electrode thereof connected to the frame reset control terminal, a first electrode thereof connected to the first control voltage terminal, and a second electrode thereof connected to the first pull-down node; and a second switching control transistor, a control electrode thereof connected to the frame reset control terminal, a first electrode thereof connected to the second control voltage terminal, and a second electrode thereof connected to the second pull-down node.

14. A method of driving a shift register unit according to claim 1, comprising:

under the control of the frame reset control signal, controlling, by a pull-down node switching control circuit, the first control voltage signal to be written into the first pull-down node, and controlling the second control voltage signal to be written into the second pull-down node.

15. The method according to claim 14, wherein the display period comprises a first display sub-period and a second display sub-period, the controlling, by a pull-down node switching control circuit, the first control voltage signal to be written into the first pull-down node, and controlling the second control voltage signal to be written into the second pull-down node under the control of the frame reset control signal comprises:

in the first display sub-period, the first control voltage signal being a first voltage and the second control voltage signal being a second voltage, during a frame start phase included in the first display sub-period, under the control of the frame reset control signal, the pull-down node switching control circuit controlling the potential at the first pull-down node to be a first voltage, and the potential at the second pull-down node to be a second voltage; and in the second display sub-period, the first control voltage signal being the second voltage, and the second control voltage signal being the first voltage, during a frame start phase included in the second display sub-period, under the control of the frame reset control signal, the pull-down node switching control circuit controlling the potential at the first pull-down node to be a second voltage, and the potential at the second pull-down node to be a first voltage.

16. The method according to claim 14, further comprising:

controlling, by the pull-up node control circuit, the first voltage signal to be written into the pull-up node in the frame start phase included in the first display sub-period and the frame start phase included in the second display sub-period under the control of the frame reset control signal.

17. The method according to claim 14, wherein the display period comprises N first display sub-periods and M second display sub-periods, and the first display sub-period and the second display sub-period are alternately arranged, and the a-th first display sub-period and an a-th second display sub-period are sequentially arranged, a time period between the a-th first display sub-period and the a-th second display sub-period comprises the a-th blank period, N, M, and a are positive integers and a<min (N, M), the method of driving the shift register unit further comprises:

during the a blank phase, controlling the first control voltage signal to be switched from a first voltage to a second voltage, and controlling the second control voltage signal to be switched from the second voltage to the first voltage.

18. The method according to claim 17, wherein N is greater than 1, the a-th second display sub-period and the (a+1)-th first display sub-period are sequentially arranged, a display period between the a-th second display sub-period and the (a+1)-th first display sub-period comprises the (a+1)-th blank phase, and the method of driving the shift register unit further comprises:

during the (a+1)-th blank phase, controlling the first control voltage signal to be switched from the second voltage to the first voltage, and controlling the second control voltage signal to be switched from the first voltage to the second voltage.

19. A gate driving circuit, comprising R stages of the shift register units according to claim 1 connected in a cascading manner, wherein R is a positive integer;

a carry signal output terminal of the (r+1)-th stage of shift register unit is connected to the reset terminal of the r-th stage of shift register unit, and is connected to the input terminal of the (r+2)-th stage of shift register unit, wherein 1≤r≤R.

* * * * *